Figure 1:
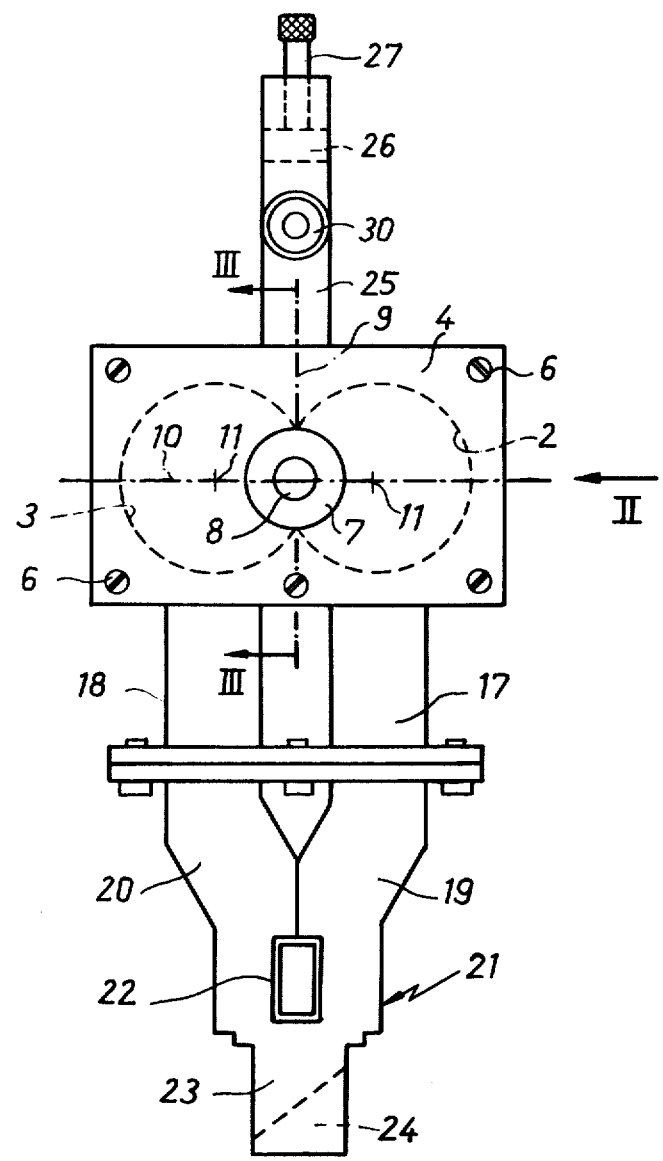

United States Patent [19]
Biehl et al.

[11] 4,314,204
[45] Feb. 2, 1982

[54] RESONATOR FOR ELECTRON SPIN RESONANCE EXPERIMENTS

[75] Inventors: Reinhard Biehl, Kassel; Dieter Schmalbein, Karlsruhe-Durlach, both of Fed. Rep. of Germany

[73] Assignee: Bruker Analytische Messtechnik GmbH, Rheinstetten, Fed. Rep. of Germany

[21] Appl. No.: 144,854

[22] Filed: Apr. 29, 1980

[30] Foreign Application Priority Data

May 3, 1979 [DE] Fed. Rep. of Germany ....... 2917794

[51] Int. Cl.³ .......................................... G01N 27/00
[52] U.S. Cl. .................................. 324/316; 324/318
[58] Field of Search .............................. 324/316, 318

[56] References Cited
U.S. PATENT DOCUMENTS

| | | | |
|---|---|---|---|
| 3,559,043 | 1/1971 | Hyde | 324/316 |
| 3,609,520 | 9/1971 | Sneed | 324/316 |
| 3,732,488 | 5/1973 | Franconi | 324/316 |

*Primary Examiner*—Michael J. Tokar

[57] ABSTRACT

A resonator for electron spin resonance experiments has two cylindrical elements of the same length arranged with their axes parallel to each other and with their end faces in the same plane so that they partly merge with each other. Devices are coupled to each of the two elements for exciting a degenerate $TM_{010}$ mode and a degenerate $TE_{111}$ mode. In one area of the resonator whose center is at the intersection point of the two planes of symmetry of the resonator, one of which is the intersection plane of the two elements and the other containing the axes of the two elements, the two modes have a mostly vanishing electric field and, for the most part, magnetic fields perpendicular to each other. In this area, there is, at least in one end face of the resonator, an aperture for inserting a test piece.

10 Claims, 5 Drawing Figures

RESONATOR FOR ELECTRON SPIN RESONANCE EXPERIMENTS

The invention is a resonator for electron spin resonance experiments in which two different wave modes of the same frequency can be excited whose magnetic fields build up approximately perpendicularly to each other in one particular area of the resonator in which the electric field practically vanishes, and which has devices for exciting the two modes and an aperture for inserting a test piece into the above-mentioned area. The centre of this aperture is at the intersection point of the two orthogonal planes of symmetry of the resonator.

With electron spin resonance experiments, just as with nuclear spin resonance experiments, it is necessary to separate the field required for exciting the electron spin resonances from the field produced by the excited electron spin. This is attained by having orthogonality between the excitation field and the field to which the resonance signal receiver devices respond. Whereas orthogonal coils are used for this purpose for nuclear spin resonance, cavity resonators must be used for electron spin experiments because of the frequencies in the GHz range. These cavity resonators must be constructed so that they permit, at the same frequency, excitation of two different wave modes whose flux lines build up mostly perpendicularly to each other so that the desired decoupling is attained. In addition, there must be an area within the resonator in which the electric field vanishes, if possible, so that the magnetic field is as uniform as possible and a considerable volume of the test piece is subjected to an alternating magnetic field which has the same intensity at all points.

A resonator well-known from U.S. Pat. No. 3,609,520 has two cavity resonators made up of rectangular waveguides. Their longitudinal axes bisect each other in the middle and the long sides of the one are parallel to the longitudinal edges of the other. The two cavity resonators are excited in the $TE_{102}$ mode via windows in one of their end walls.

In the case of this well-known resonator, the orthogonality of the magnetic fields is dependent, to a large degree, on the accuracy with which the two waveguide sections are orthogonally aligned with each other. In spite of this, the slightest disturbance of the symmetry can lead to the excitation of modes which disturb the orthogonality of the fields. Therefore, additional measures are necessary in order to guarantee the desired decoupling of the modes, i.e. the fitting of conducting bars at the limits of the commom cavity area (mode fences). Apart from the difficulties which this well-known resonator has with regard to its construction and tuning, it has a particular disadvantage in that one of the two waveguides lies in the direction of the d.c. magnetic field which has to be applied for electron spin resonance experiments. Therefore, this resonator can only be used in field magnets with very large air gaps. This again makes it impossible to produce a uniform magnetic field in the central area of the test piece of the required intensity for good resolution.

From both U.S. Pat. No. 3,609,520 (FIG. 3) and German DE-OS No. 19 49 944 resonators are known which consist of square waveguides so that two $TE_{01n}$ modes whose electric fields are perpendicular to each pair of opposite sides of the resonator can be excited in the one resonator. In the case of this kind of cavity resonator, the desired orthogonality of the modes is dependent on the walls of the cavity resonator being exactly perpendicular to each other. The slightest asymmetry, which can also be conditional on the tuning elements, causes coupling between the two modes. In addition, with this resonator, it is difficult to adjust the resonance frequency of one of the modes independently of the resonance frequency of the other mode, as in necessary in many experiments. This also applies if, in the case of the excited mode $TE_{10n}$, the index n is greater than 2 and the cavity resonator has a configuration with one or several bends in it, as is the case with several of the DE-OS 19 49 944 resonators.

In contrast to this, the basis of the invention was to develop a resonator for electron spin resonance experiments of the type mentioned in the introductory paragraph so that it meets the great requirements made of such a resonator and, in addition, is easy to manufacture.

This task is solved according to the invention in that the resonator has two cylindrical elements of the same length with their axes parallel to each other and with their end faces in the same plane so that they partly merge with each other, in that the devices for exciting the two modes are coupled to the two elements in such a way that they excite a degenerate $TM_{010}$ mode and a degenerate $TE_{111}$ mode in each of the elements and in that the aperture for inserting a test piece is located in one of the end faces of the resonator and of the two planes of symmetry, one is the intersection plane of the two elements and the other contains the axes of the two elements.

The modes excited in the two elements of the resonator have an electric field whose axial component vanishes at the cylindrical resonator walls. Therefore, with the degenerate wave mode resulting from the combination of the two elements, the axial component of the electric field is approximately zero in the area of the plane of intersection also. The magnetic fields of the two wave modes build up vertically to each other in the area of the plane of intersection, with the result that, here, the high degree of decoupling and required uniformity of the magnetic fields are attained. By coupling the two cylindrical elements, an extraordinarily stable field configuration is obtained which is not disturbed to any significant extent by inserting a test piece through the aperture provided in this part of one of the end faces of the resonator. The manufacture of cylindrical resonators and combining them in an arrangement according to the invention presents no particular difficulties and this can be done with a very high degree of precision, which is of very great importance for the practical use of such a resonator.

The device for exciting the degenerate $TM_{010}$ mode can comprise two waveguides fed in phase opposition which are coupled, with the long sides parallel to the end faces of the resonator in the centre plane of the resonator, to the elements by means of windows which run parallel to the long sides. Feeding these parallel waveguides in phase opposition can easily be done by means of a decoupled branch to whose arms the two waveguides are connected. This arrangement makes possible not only simple completely symmetrical excitation of the degenerate $TM_{010}$ mode, but at the same time guarantees compensation of the primary fields from the windows, because of the symmetry of the arrangement. With the well-known resonators, the wave modes are usually only excited at one single point of the resonator, with the result that the primary fields from the exciter element are superposed on the excited wave mode and, thus, lead to errors of symmetry and to disturbances.

The device for exciting the degenerate $TE_{111}$ mode is formed by a waveguide coupled to the two elements, with the long sides perpendicular to the end faces of the resonator being symmetrical to the intersection plane. This coupling is again completely symmetrical to the two cylindrical elements of the resonator, which again leads to perfect compensation of the primary fields. A further advantage of this arrangement is that the full cross-section of the waveguide arranged symmetrically to the intersection plane can open into the resonator. This brings about very strong coupling of the waveguide with the result that it is possible to fit this waveguide with a shorting plunger at the end away from the resonator with which it is possible to influence the resonance frequency of the resonator. The adjustment possible in this way is approximately ±5% of the average resonance frequency of the resonator. In order to connect or disconnect power, a further line, for example a coaxial line, can be connected to the waveguide by means of a coupling loop. It is advisable to fit a tube whose diameter is small in relation to the length of a free wave with the resonance frequency of the resonator to the end face of the resonator with the test piece aperture so that it surrounds the test piece aperture. This prevents high-frequency power discharging from the test piece aperture as a wave entering the electrically conducting tube is strongly damped because of the small diameter. In spite of these measures, however, slight disturbances in the symmetry of the fields in the resonator cannot be avoided. However, they can be compensated by having a compensating aperture concentric with the test piece aperture in the end face opposite the end face with the test piece aperture and by connecting an electrically conducting tube to this as well. Then, it is possible to fit tuning elements in the tube connected to the compensating which then permit compensation of the errors of symmetry caused by the insertion of a test piece. A preferred type of the invention has the feature that the second tube connected to the compensating aperture has a larger diameter than the first tube connected to the test piece aperture and a sliding metal bush whose inside diameter is the same as the diameter of the first tube is fitted in the second tube. Errors of symmetry caused by the insertion of the test piece, too, can be compensated easily by sliding along the bush.

The invention is described and explained in more detail below on the basis of the example represented in the drawing. The feature described in the specification and the drawing can be used in other types of the invention individually or in any combination. The figures show the following:

FIG. 1 Plan view of a resonator according to the invention.

Figure 2:
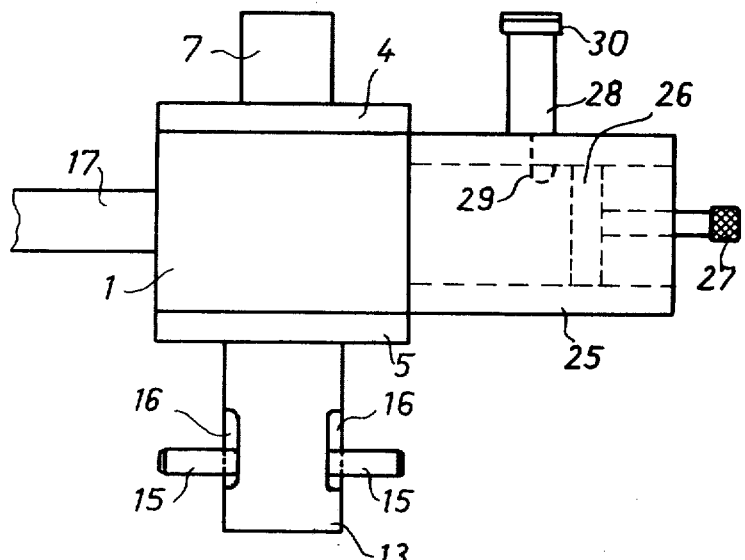

FIG. 2 Side view of the arrangement in FIG. 1 in the direction of arrow II.

Figure 3:
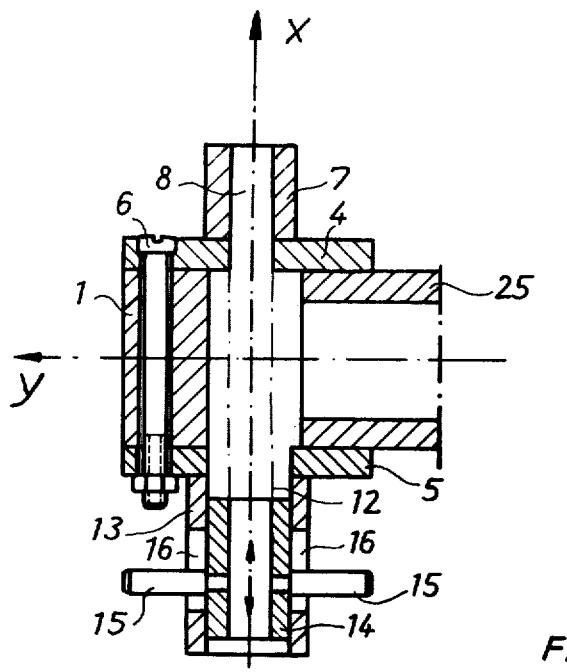

FIG. 3 Section along line III—III through the arrangement in FIG. 1.

Figure 4:
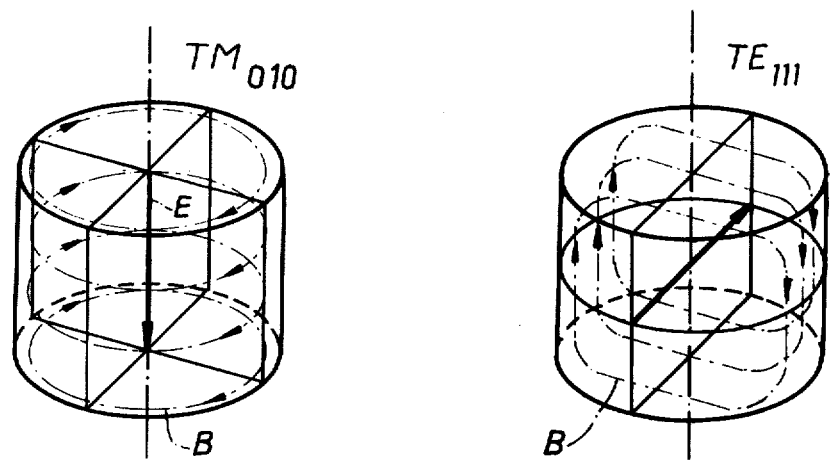
Figure 4:
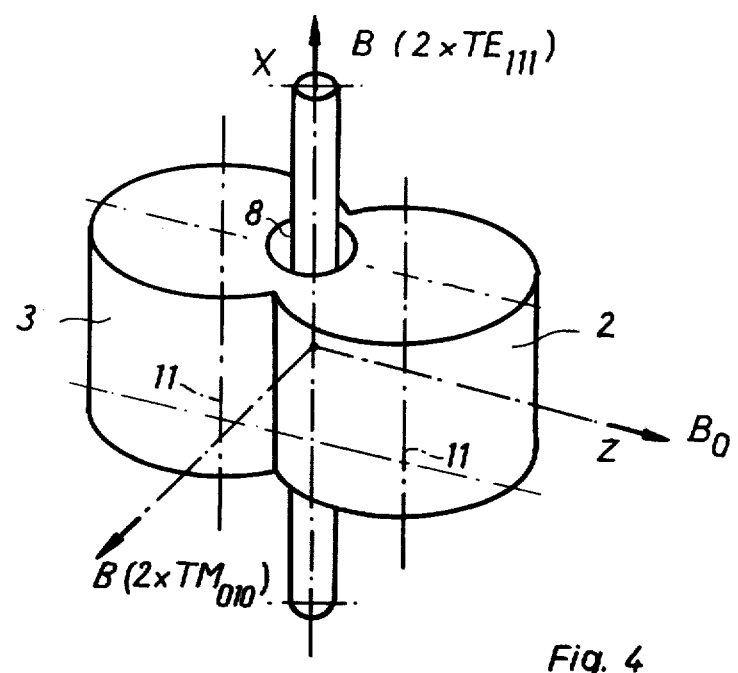

FIG. 4 Schematic diagram of the modes in such a resonator together with the test piece arrangement.

Figure 5:
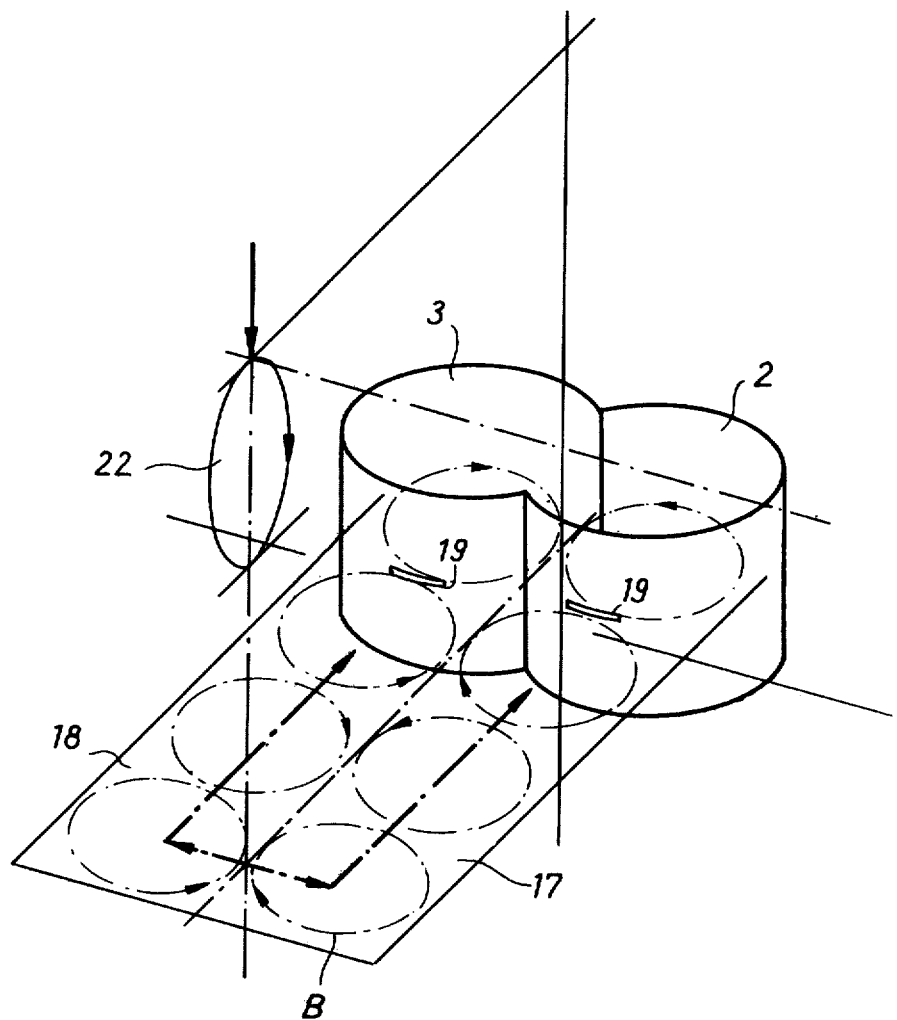

FIG. 5 Schematic diagram to show the type of excitation of the $TM_{010}$ wave mode.

Figure 6:
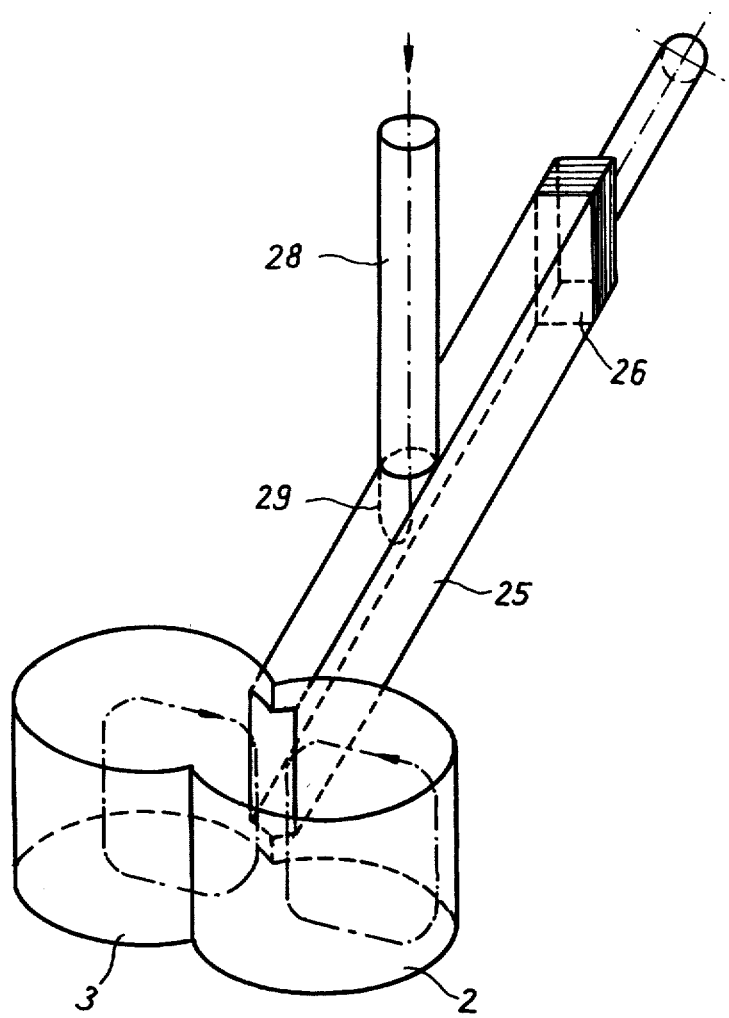

FIG. 6 Schematic diagram to show the excitation of the $TE_{111}$ wave mode.

The resonator shown in the drawing has a central block 1, containing two cylindrical cavities 2 and 3 indicated by the dashed lines in FIG. 1 which partly merge into each other and form the cylindrical elements of the resonator. These cavities are closed off at their ends by covers 4 and 5 which are fastened to the block 1 by means of screws 6. The middle of one of the covers 4 is fitted with a tube 7 which surrounds the test piece aperture 8 in the cover. The centre of the test piece aperture is situated at the intersection point of the two planes of symmetry 9 and 10 of which one 9 coincides with the plane of intersection of the two elements of the resonator and the other 10 runs through the axes 11 of the two cavities 2 and 3 forming the elements of the resonator. The other cover 5 has a compensating aperture 12 concentric with the test piece aperture 8. The compensating aperture has a greater diameter than the test piece aperture 8 and is also surrounded by an electrically conducting tube 13. This tube 13 is also fitted with a bush 14 made of electrically conducting material and its inside diameter is the same as that of the test piece aperture 8. The bush 14 can be slid along the tube 13 of the compensating aperture 12 by means of bolts 15 which are screwed radially into the bush and drive axial guides 16 into the tube 13.

Two waveguides 17 and 18 are connected to the side of the centre block 1 which runs parallel to the plane of symmetry 10 connecting the axes 11 so that their long sides are parallel with the end faces of the resonator formed by the covers 4 and 5. In addition, their centre planes perpendicular to the long sides run through axes 11 of the elements of the resonator. These two waveguides 17 and 18 are coupled to the cavities 2 and 3 of the resonator by windows 19 shown in FIG. 5 and which extend parallel to the long sides of the waveguides 17 and 18. The two waveguides 17 and 18 are connected to the arms 19 and 20 of a modified magic T 21 whose E arm 22 can be connected to a source applying excitation power whilst the H arm 23 can be terminated in a characteristic impedance 24 shown by a broken line in FIG. 1. A further waveguide 25 is let into the side of the central block 1 opposite the waveguides 17 and 18 but is arranged so that its centre plane parallel to the long sides coincides with the plane of intersection 9 of the resonator. The full cross-section of this waveguide 25 opens into the resonator. At the end away from the resonator, the waveguide 25 is terminated by a shorting plunger 26 which can be moved, by means of a regulating screw 27, in the longitudinal direction of the waveguide 25. A coaxial line 28 is connected to one of the narrow sides of the waveguide 25 and its neutral conductor forms a coupling loop penetrating into the waveguide 25. At its free end, the coaxial line 28 can be fitted with a standard coaxial connector 30 for connection to a receiver. Of course, a receiver can also be fitted directly to the coaxial line.

$TM_{010}$ wave modes are excited in cavities 2 and 3 via waveguides 17 and 18. As FIG. 4 shows, top left, the $TM_{010}$ wave mode has closed circular B lines whereas the E lines run perpendicular to the end faces of the cavities. The electric field reaches a maximum in the centre of the cavity and vanishes at the cavity cylinder wall.

As a result of feeding power into the E arm waves in phase opposition in the connected waveguides 17 and 18 are excited by the magic T 21 and in turn these waves excite waves in phase opposition in the elements of the resonator formed by the cavities 2 and 3 (FIG. 5). The two $TM_{010}$ wave modes combine in that area of the resonator surrounding the intersection point between the two planes of symmetry 9 and 10 to form a B field whose flux lines run parallel to the end face of the resonator and parallel to the plane of intersection 9 and have a high density in this area, whereas the electric field in this area is approximately zero. This field extends thus in the system of co-ordinates shown in FIG. 4 in the direction of the y-axis.

If the resonator is set up in a d.c. magnetic field $B_0$ whose flux lines run parallel to the plane of symmetry 10 which cuts the two axes 11 of the elements of the resonator, i.e. along the z-axis in FIG. 4, then, in a test piece in that area of the resonator that surrounds the intersection line between the two planes of symmetry 9 and 10, an alternating magnetic field will be excited extending along this intersection line or the x-axis shown in FIG. 4. Two $TE_{111}$ wave modes are excited in the cylindrical elements of the resonator by this and the behaviour of their flux lines is shown in FIG. 4, top right. This wave mode has magnetic flux lines which have a component parallel to the cylinder wall, whereas the electric field mostly runs parallel to the diameter of the resonator. The electric field vanishes at those points on the periphery of the resonator where the magnetic flux lines reaches a maximum. The design of the resonator according to the invention necessitates alignment of the $TE_{11}$ wave modes so that the magnetic field is at its maximum in the area surrounding the x-axis, whilst the electric field vanishes in this area. As shown in FIG. 6, this field is decoupled from the resonator with the aid of the waveguide 25, whose long sides are perpendicular to the covers 4 and 5 of the resonator, i.e. run parallel to the x-axis with the result that the magnetic flux lines of the $TE_{111}$ mode run parallel to the long sides of the waveguide 25, as do the magnetic flux lines 1 of the $TE_{10}$ mode excited in the waveguide.

The whole cross-section of the waveguide 25 with its long side perpendicular to the covers 4 and 5 opens into the resonator. In this way, extremely strong coupling of the waveguide to the resonator is achieved and, consequently, the impedance of the waveguide at the transition point with the resonator influences the resonance frequency of the resonator in the $TE_{111}$ mode. This fact is used in the example given to change the resonance frequency in the $TE_{111}$ mode by shifting the short-circuit 26 fitted in the waveguide 25. In the case of the types of resonators constructed according to the invention, it was possible to alter the resonance frequency by ±5% of the average resonance frequency. Therefore, it is possible to establish frequency coincidence of the excitation and detection modes, which otherwise could be disturbed by insertion of the test piece, particularly if a quartz Dewar is used for tempering the test piece.

As shown in FIG. 4, the test piece is inserted into the resonator along the x-axis. The test piece aperture 8 is provided in the cover 4 for this purpose. The conducting tube 7 surrounding the test piece aperture 8 prevents any power from radiating from this aperture. It has been discovered, however, that the arrangement of the test piece aperture can disturb the symmetry of the modes in the resonator. These disturbances can, however, be compensated by a compensating aperture 12 in the opposite side. At the same time, the effect of this aperture in the end face of the resonator can be used to remove disturbances in the electrical orthogonality caused by asymmetries in the manufacturing process. The bush 14 fitted in the tube 13 in the compensating opening 12 for this purpose just has to be simply moved to bring about optimum decoupling of the excitation and detection sides.

In the case of one of the types of resonator constructed according to the invention, the cylindrical cavities 2 and 3 had a diameter of approximately 24 mm. The height of the cavities was also approximately 24 mm. With the $TM_{010}$ and $TE_{111}$ modes, the resonator had an average resonance frequency of approximately 9.5 GHz. Using the shorting plunger 26, it was possible to change the frequency of the resonance of the $TE_{111}$ wave mode by more than 1 GHz. With critical coupling the resonator had an energy factor of approximately $3 \times 10^3$. Even if non-cylindrical solid-state test pieces were inserted and quartz Dewars used, reproducible decoupling values of −80 to −88 dB were obtained. The measured limit for decoupling was around −90 dB which was because of the high radio interference level of the microwave bridge used for the measurements and which could not be easily removed. Particularly important is also the fact that using the resonator according to the invention also permits a reduction of the signal/noise ratio of the recorded spectrum by 1 to 2 orders of magnitude.

Summarizing, it should be stated that the invention has created a resonator which permits reproducible decoupling of the detection side from the excitation side around −85 dB to −90 dB. One of the reasons for this is that not only the excited modes but also the primary fields used to excite these modes are compensated independently of the frequency.

Exact agreement between the resonance of the excitation field and the resonance of the detecting field is made possible by just the one existing control element—the shorting plunger.

There is also just one compensating element with which residual errors of symmetry resulting from the manufacture of the test head or caused by insertion of the test piece to be examined can be removed.

The area available for exciting the test piece where there is a practically uniform field is big enough to accommodate test piece of considerable size and devices for tempering the test piece.

The resonator according to the invention takes up only the minimum amount of space so that if typical iron magnets are used to produce the d.c. magnetic field an air gap 50 mm wide is adequate, such as is available with conventional magnets.

The relatively low energy factor of the resonator makes it possible to carry out pulse experiments without any signal falsification caused by long rise times of the resonator. In spite of this, a spectrometer fitted with this resonator has a high degree of sensitivity because the resonator permits the insertion of relatively large test pieces (space factor $\eta$).

What we claim is:

1. A resonator for electron spin resonance experiments in which two different wave modes of the same frequency can be excited, whose magnetic fields build up at least approximately perpendicular to each other in a certain area of the resonator in which the electrical field mostly vanishes if possible, and which is fitted with devices for exciting the two modes and has an aperture through which a test piece is inserted into the above-mentioned area whose centre is situated at the point of intersection of the two orthogonal planes of symmetry of the resonator, characterized in that the resonator has two cylindrical elements (2,3) of the same length arranged with axes parallel to each other (11) and with end faces in the same planes so that they partly merge with each other, in that the devices for exciting the two modes are coupled to the two elements so that in each of the elements they excite a degenerate $TM_{010}$ mode and a degenerate $TE_{111}$ mode, and in that the aperture (8) for introducing a test piece is arranged in one of the end faces of the resonator and that of the two planes of symmetry (9,10), one forms the plane of intersection of the two elements and the other contains the axes (11) of the two elements.

2. Resonator according to claim 1, characterized in that the device for exciting the degenerate $TM_{010}$ mode comprises two waveguides (17,18) fed in phase opposition which, with the long sides parallel to the end faces of the resonator in the centre plane of the resonator, are coupled to the elements by means of windows which are parallel to the long sides.

3. Resonator according to claim 2, characterized in that the two waveguides (17,18) are connected to the arms (19,20) of a decoupled branch (21).

4. Resonator according to claim 1, characterized in that the device for exciting the degenerate $TE_{111}$ mode is made up of a waveguide (25) which, with the long sides perpendicular to the end faces of the resonator being symmetrical to the intersection plane (9), is coupled to the two elements.

5. Resonator according to claim 4, characterized in that the full cross-section of the waveguide arranged symmetrically to the intersection plane (9) opens into the resonator and the end away from the resonator is fitted with a shorting plunger (26) and that a further line (28) for coupling or decoupling power is connected to this waveguide (25).

6. Resonator according to claim 5, characterized in that the further line (28) is formed by a coaxial line connected to the waveguide (25) by means of a coupling loop (29).

7. Resonator according to claim 1, characterized in that the end face of the resonator with the test piece aperture (8) is fitted with an electrically conducting tube (7) surrounding the test piece aperture (8) and its diameter is small in relation to the length of a free way with the resonance frequency of the resonator.

8. Resonator according to claim 7, characterized in that there is a compensating aperture (12) in the end face opposite the end face with the test piece aperture (8) concentric with it, to which an electrically conducting tube (13) is also connected.

9. Resonator according to claim 8, characterized in that tuning elements are fitted in the tube (13) connected to the compensating aperture.

10. Resonator according to claim 9, characterized in that the second tube (13) connected to the compensating opening (12) has a greater diameter than the first tube (7) connected to the test piece aperture (8) and a sliding metal bush (14) whose inside diameter is the same as the diameter of the first tube (7) is fitted in the second tube (13).

* * * * *